United States Patent
Gamboa et al.

(10) Patent No.: US 10,502,787 B2
(45) Date of Patent: Dec. 10, 2019

(54) APPARATUS AND METHOD FOR TESTING STATOR CORE OF GENERATOR

(71) Applicant: Siemens Energy, Inc., Orlando, FL (US)

(72) Inventors: Gustavo Gamboa, Oviedo, FL (US); James F. Lau, Orlando, FL (US)

(73) Assignee: SIEMENS ENERGY, INC., Orlando, FL (US)

( * ) Notice: Subject to any disclaimer, the term of this patent is extended or adjusted under 35 U.S.C. 154(b) by 122 days.

(21) Appl. No.: 15/609,561

(22) Filed: May 31, 2017

(65) Prior Publication Data

US 2018/0348302 A1 Dec. 6, 2018

(51) Int. Cl.
*G01R 31/34* (2006.01)
*G01R 31/00* (2006.01)

(52) U.S. Cl.
CPC .................... *G01R 31/34* (2013.01)

(58) Field of Classification Search
CPC .. G01R 31/34–346; H02P 29/024–032; G01N 27/72; G01N 27/82–9093
See application file for complete search history.

(56) References Cited

U.S. PATENT DOCUMENTS

| | | | | |
|---|---|---|---|---|
| 4,926,105 A * | 5/1990 | Mischenko | ............. | H02P 21/06 318/800 |
| 5,341,095 A * | 8/1994 | Shelton | .................. | G01R 31/34 324/545 |
| 7,605,592 B2 | 10/2009 | Baca et al. | | |
| 2003/0117144 A1* | 6/2003 | Sutton | .................. | G01R 31/343 324/546 |
| 2004/0000923 A1* | 1/2004 | Fischer | ................ | G01R 31/343 324/765.01 |
| 2004/0124833 A1* | 7/2004 | Kliman | .................. | G01N 27/82 324/241 |
| 2006/0262442 A1* | 11/2006 | Best | ........................ | H02K 3/522 360/1 |
| 2009/0001843 A1* | 1/2009 | Enomoto | ............... | H02K 1/145 310/257 |
| 2011/0191034 A1* | 8/2011 | Lee | ........................ | G01R 31/343 702/35 |
| 2012/0076277 A1* | 3/2012 | Biehr | ..................... | H01J 35/101 378/131 |
| 2013/0191041 A1* | 7/2013 | Guan | .................... | G01N 27/904 702/38 |

(Continued)

FOREIGN PATENT DOCUMENTS

EP 2816365 A1 12/2014

*Primary Examiner* — Huy Q Phan
*Assistant Examiner* — David B Frederiksen

(57) ABSTRACT

An apparatus and a method for testing a stator core of a generator are presented. The apparatus includes a power supply. The power supply provides an excitation current having a base frequency. A frequency convertor is connected to the power supply. The frequency convertor converts the base frequency of the excitation current to an excitation frequency that is greater than the base frequency. An excitation cable connects the frequency convertor to a rotor at two axial ends. The rotor is excited by the excitation current with the excitation frequency as a single excitation winding for simulating an operation state of the generator causing hot spots on the stator core without overheating the rotor.

16 Claims, 1 Drawing Sheet

(56) References Cited

U.S. PATENT DOCUMENTS

2013/0234752 A1* 9/2013 Jaszcar ................ H02K 15/00
  324/765.01
2014/0347042 A1* 11/2014 Hobelsberger ..... G01R 27/2611
  324/240

* cited by examiner

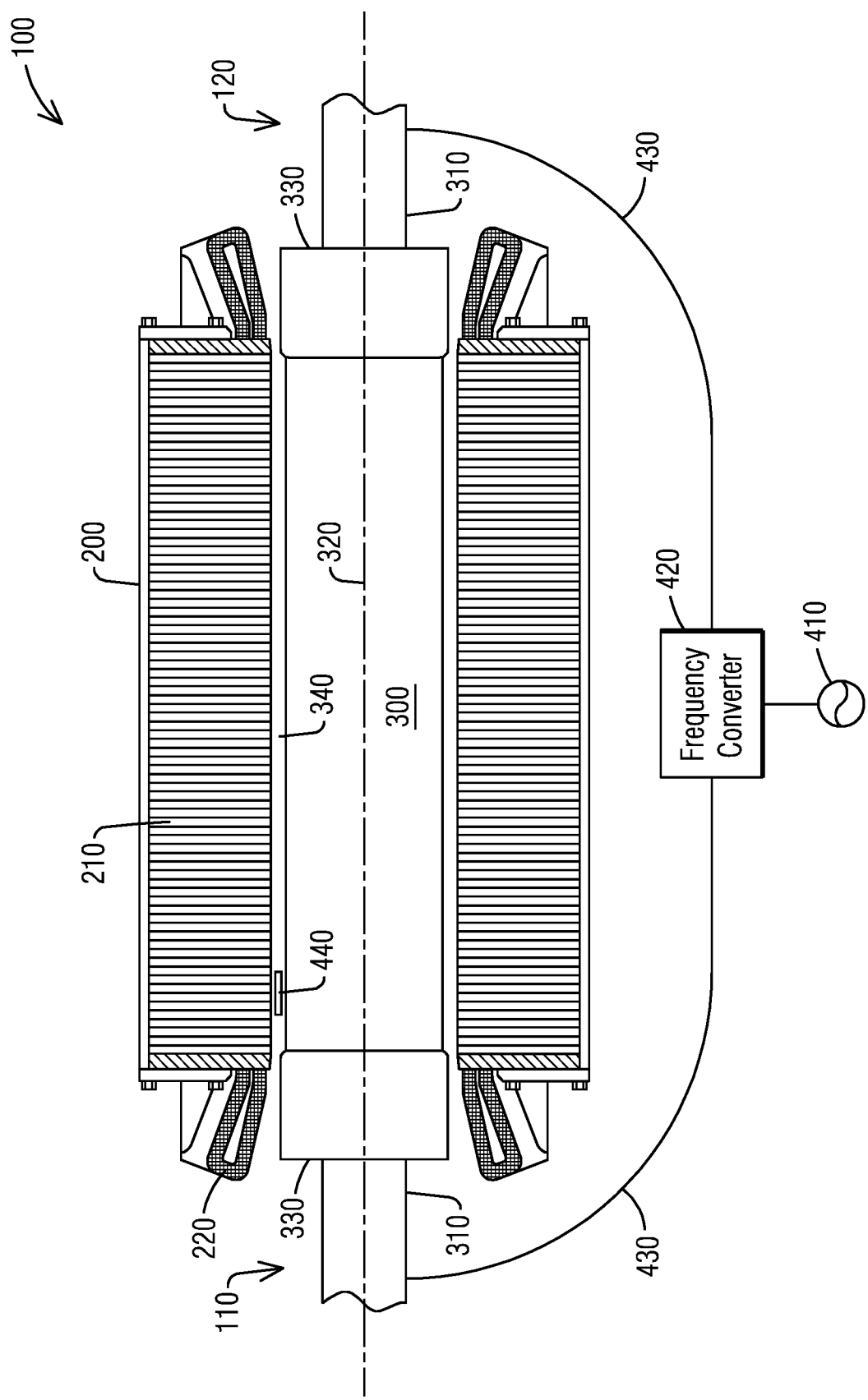

APPARATUS AND METHOD FOR TESTING STATOR CORE OF GENERATOR

TECHNICAL FIELD

The present invention relates generally to an apparatus and a method for testing a stator core of a generator.

DESCRIPTION OF RELATED ART

A generator is a component in power generation industry that converts mechanical power to electrical power. A generator typically includes a stator and a rotor. A generator stator may employ a stator core comprised a plurality of axially extending slots along an internal circumference of the stator core. Stator windings are placed in the slots with insulation from the stator core. A rotor may rotate within the stator core driven by a turbine. The rotor may carry a rotor winding energized by an excitation current from an exciter. A rotating magnetic flux may be produced by the rotor winding rotating within the stator core, which cuts stator windings and generates alternating current within the stator windings.

A stator core may consist of a plurality of stacked thin metal laminations. The laminations are insulated from each other by a very thin dielectric. The laminations direct magnetic flux around the stator core. If a number of laminations short together such that a loop can be established around the magnetic flux, then current will flow in that loop generating heat. Shorting of laminations may occur very often due to foreign objects which may smear the laminations together or may provide a path by connecting adjacent laminations with a conductive material. Other modes of lamination to lamination shorting may occur due to excessive heat from various sources affecting the dielectric coating. A damaged insulation of stator core may result in higher eddy current and a higher local temperature, also known as a local hot spot, between several laminations. The damage may spread out along the stator core over time and may cause damage of the generator. It is recommended to regularly check the insulation of the stator core to avoid possible consequential damages of the generator.

Electromagnetic Core Imperfection Detection (ELCID) is an economical means to test insulation condition of a stator core. However, ELCID may only provide limited information on insulation condition of stator core. A loop test may be recommended when ELCID identifies concerns of the stator core insulation. A loop test may simulate an operating state of the generator which leads to the heating of the stator core. A loop test may be conducted using excitation cables wrapped through the stator core where the rotor is normally installed. Excitation cables may consist of numbers of turns depending on volume of the stator core. However, such a loop test may require removal of rotor which may require a considerably long time and incur a significant financial burden. Alternatively, a loop test may be conducted by wrapping the excitation cables within air gap between the stator core and the rotor. However, such an arrangement may block ability to monitor condition of stator core insulation during the loop test.

SUMMARY OF INVENTION

Briefly described, aspects of the present invention relate to an apparatus and a method for testing a stator core of a generator.

According to an aspect, an apparatus for testing a stator core of a generator is presented. The apparatus comprises a power supply that is configured to provide an excitation current having a base frequency. The apparatus comprises a frequency convertor that is connected to the power supply. A rotor is installed within the stator core. The apparatus comprises an excitation cable connecting the frequency convertor to the rotor at two axial ends. The frequency convertor is configured to convert the base frequency of the excitation current to an excitation frequency that is greater than the base frequency. The excitation cable transmits the excitation current with the excitation frequency to the rotor. The rotor is excited by the excitation current with the excitation frequency as a single excitation winding for simulating an operation state of the generator increasing a temperature of the stator core without overheating the rotor during testing.

According to an aspect, a method for testing a stator core of a generator is presented. The method comprises providing an excitation current having a base frequency by a power supply. The method comprises converting the base frequency to an excitation frequency by a frequency convertor. The excitation frequency is greater than the base frequency. The method comprises transmitting the excitation current with the excitation frequency to a rotor via an excitation cable. The rotor is installed within the stator core. The excitation cable connects the frequency convertor to the rotor at two axial ends. The method comprises exciting the rotor as a single excitation winding for simulating an operation state of the generator increasing temperature of the stator core without overheating the rotor during testing.

Various aspects and embodiments of the application as described above and hereinafter may not only be used in the combinations explicitly described, but also in other combinations. Modifications will occur to the skilled person upon reading and understanding of the description.

BRIEF DESCRIPTION OF DRAWINGS

Exemplary embodiments of the application are explained in further detail with respect to the accompanying drawings. The FIGURE illustrates a schematic cross section view of a generator having an arrangement for testing a stator core of a generator according to an embodiment of present invention.

DETAILED DESCRIPTION OF INVENTION

A detailed description related to aspects of the present invention is described hereafter with respect to the accompanying FIGURE.

FIGURE illustrates a schematic cross section view of a generator 100 having an arrangement for testing a stator core of the generator 100 according to an embodiment of present invention. The generator 100 includes a stator 200 and a rotor 300. The stator 200 and the rotor 300 may extend axially toward two axial ends 110 and 120. The rotor 300 may be installed within the stator 200. The stator 200 has a stator core 210 comprised of a plurality of stacked thin metal laminations. A stator winding 220 may be arranged within the stator core 210.

The rotor 300 may include a rotor shaft 310 which may rotate the rotor 300 about a rotation axis 320. The rotor 300 may have two rotor retaining rings 330 arranged at two axial ends 110 and 120. The rotor shaft 310 may axially extend through the retaining rings 330 toward two axial ends 110 and 120. An air gap 340 may exist between the stator core 230 and the rotor 300.

The rotor 300 may have rotor windings (not shown). During operation of the generator 100, an exciter (not shown) may transmit excitation current to rotor windings. The excitation current flows through rotor windings that generates magnetic field. Strength of the magnetic field is directly proportional to intensity of the excitation current. The rotor 300 may be driven by a turbine (not show) to rotate at a frequency of, typically 50 Hz or 60 Hz. The magnetic field may induce magnetic flux and voltage on a stator core 210.

In operation of the generator 100, the induced voltage and current on stator core 210 may generate significant amount of heat on the stator core 210 that may damage insulations between individual laminations of the stator core 210. This may increase temperatures of the stator core 210 which may cause hot spots on the stator core 210.

A loop test may be performed during maintenance or outage of the generator 100 to predict an induced voltage on a stator core 210. During the loop test, at least a loop of an excitation winding is wrapped around the stator core 210 to measure the induced flux and voltage on the stator core 210. The induced voltage on the stator core 210 may be defined by the following function:

$$V = \frac{2\pi}{\sqrt{2}} f \times B \times A \quad (1)$$

Where: V: induced longitudinal voltage on a stator core, V/m,
f rotation frequency of rotor,
B: induced magnetic flux density on a stator core, T, and
A: cross section area of the stator core affected by the induced magnetic flux, m².

An apparatus for testing the stator core 210 is illustrated in the FIGURE according to an embodiment. In the exemplary embodiment, a rotor 300 is installed within a stator core 210. An excitation cable 430 may be connected to the rotor 300 at two axial ends 110 and 120. The excitation cable 430 may be connected to the rotor shaft 310 of the rotor 300 at the two axial ends 110 and 120 in a location beyond the rotor retaining rings 330.

The excitation cable 430 may be connected to a frequency converter 420. The frequency converter 420 may also be connected to an AC power supply 410 such that an excitation current may be transmitted to the excitation cable 430. The excitation cable 420 may transmit the excitation current to the rotor 300. The rotor 300 may be excited by the excitation current as a single excitation winding to induce magnetic flux density B on the stator core 210. An operation state of the generator 100 may be simulated for testing the stator core 210, such as a temperature distribution of the stator core 210 that may indicate a higher local temperature of the stator core 210, also known as a local hot spot on the stator core 210. The AC power supply 410 may operate at a base frequency f corresponding to a rotation frequency of the rotor 300, typically at 50 Hz or 60 Hz.

It can be seen from equation (1), that frequency f of excitation current is inversely proportionally to the induced magnetic flux density B on the stator core 210 for a given induced longitudinal voltage V. For example, using an excitation current at 50 Hz frequency, a roughly 100 V/m induced longitudinal voltage V on stator windings 220 may require an induced magnetic flux density B on stator core 210 approximately up to 1 T. However, using an excitation current at 500 Hz frequency, a roughly 100 V/m induced longitudinal voltage V on stator windings 220 may only require an induced magnetic flux density B on stator core 210 approximately to 0.1 T. 100 V/m induced longitudinal voltage V on stator windings 220 may approximately correspond to 85% of normal operation state of a generator 100.

The induced magnetic flux density B on stator core 210 is directly proportional to intensity of the excitation current. For simulating the same operation state of the generator 100 that may increase temperature of the stator core 210 causing hot spots on the stator core 210, intensity of the excitation current may be reduced inversely proportionally to frequency of the excitation current such that the excitation current may flow through the rotor 300 without overheating the rotor 300 during testing. The rotor 300 may be a single excitation winding for testing the stator core 210.

According to an embodiment, the frequency converter 420 may convert the base frequency of the excitation current provided by the AC power supply 410 to an excitation frequency that is greater than the frequency of the AC power supply 410. The frequency converter 420 may transmit the excitation current with the excitation frequency to the rotor 300 via the excitation cable 430. The rotor 300 may induce a longitudinal voltage V on the stator windings 220, but at a reduced magnetic flux density B compared to a test using excitation current with the base frequency. For example, the magnetic flux density B on stator core 210 may be reduced from 1 T to less than 0.15 T or less than 0.1 T, etc. The simulated operation state may increase temperature of the stator core 210 causing hot spots on the stator core 210. For example, the simulated operation state may correspond to at least 70%, or at least 80%, or at least 90% of normal operation state of the generator 100.

The reduced magnetic flux density B may result in a reduced intensity of the excitation current provided by the AC power supply 410. According to an embodiment, the frequency converter 420 may convert a base frequency of the excitation current to an excitation frequency to reduce the intensity of the excitation current to an amount such that the excitation current is able to be transmitted to the rotor 300 without overheating the rotor 300 for a simulated operation state of the generator 100. The frequency converter 420 may convert the base frequency to the excitation frequency that may be at least 8 times greater than the base frequency, or at least 9 times greater than the base frequency, or at least 10 times greater than the base frequency, etc. The base frequency of the AC power supply 410 may be at 50 Hz or 60 Hz. The excitation frequency may be greater than 400 Hz, or greater than 500 Hz, or greater than 600 Hz, etc. The excitation frequency of the excitation current may be defined based on design requirement of the rotor 300. The excitation frequency of the excitation current may be defined based on simulated operation state of the generator 100.

The reduced intensity of excitation current may reduce power output of the AC power supply 410. For example, the power output of the AC power supply 410 may be reduced from 3 MW at 50 Hz excitation current test, down to 400 KW, 300 KW, or 200 KW, at 500 Hz or greater frequency excitation current test. Size and weight of the AC power supply 410 may also be reduced. The AC power supply 410 may be portable. Test setup may be considerably smaller.

Temperatures of the stator core 210 during testing may be monitored by a thermal sensor 440. The thermal sensor 440 may record the temperatures of the stator core 210 for detecting higher local temperatures, also known as hot spots on the stator core 210. The thermal sensor 440 may have a thermal camera. The thermal sensor 440 may be mounted on a robot. The thermal sensor 440 may be arranged in the air gap 340 between the stator core 210 and the rotor 300.

According to an aspect, the proposed apparatus for testing a stator core 210 uses a rotor 300 as a single excitation winding. The proposed apparatus may simulate an operation state of a generator 100 that is substantially close to a normal operation state of the generator 100. The simulated operation state of the generator 100 may increase temperature of the stator core 210 causing hot spots on the stator core 210. The rotor 300 may be installed within the stator core 210 during the testing. The proposed apparatus may provide reliable information of the stator core 210 using the rotor 300 as the single excitation winding without overheating the rotor 300. The proposed apparatus may test insulation condition of the stator core 210 without removing the rotor 300 out of the stator 200. The proposed apparatus may significantly reduce cost and duration for performing a loop test, thus significantly increase efficiency in performing the loop test. The proposed apparatus may significantly reduce complexity for setting up the loop test.

Although various embodiments that incorporate the teachings of the present invention have been shown and described in detail herein, those skilled in the art can readily devise many other varied embodiments that still incorporate these teachings. The invention is not limited in its application to the exemplary embodiment details of construction and the arrangement of components set forth in the description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

REFERENCE LIST

100: Generator
110, 120: Axial Ends
200: Stator
210: Stator Core
220: Stator Winding
300: Rotor
310: Rotor Shaft
320: Rotation Axis
330: Rotor Retaining Ring
340: Air Gap between Stator Core and Rotor
410: AC Power Supply
420: Frequency Converter
430: Excitation Cable
440 Thermal Sensor

What is claimed is:

1. An apparatus for testing a stator core of a generator comprising:
   a power supply configured to provide an excitation current having a base frequency;
   a frequency convertor connected to the power supply, the frequency convertor is configured to convert the base frequency of the excitation current to an excitation frequency that is greater than the base frequency;
   a rotor installed within the stator core; and
   an excitation cable connected to both axial ends of the rotor forming an excitation winding, with a single loop, between the excitation cable and the rotor,
   wherein the frequency convertor is connected to the excitation winding
   wherein during testing the excitation current is transmitted from the power supply onto the excitation winding by way of the frequency converter,
   wherein the frequency convertor is configured to convert the base frequency of the excitation current to an excitation frequency that is greater than the base frequency, and
   wherein the rotor is excited by the excitation current with the excitation frequency as a single excitation winding for simulating an operation state of the generator increasing a temperature of the stator core without overheating the rotor during testing.

2. The apparatus as claimed in claim 1, wherein the excitation cable is connected to a rotor shaft of the rotor at the two axial ends in a location beyond a rotor retaining ring.

3. The apparatus as claimed in claim 1, wherein the base frequency of the excitation current is at 50 Hz or 60 Hz.

4. The apparatus as claimed in claim 1, wherein a loop test is performed.

5. The apparatus as claimed in claim 4, wherein the simulated operation state of the generator causes a hot spot on the stator core.

6. The apparatus as claimed in claim 4, wherein the excitation frequency of the excitation current is greater than the base frequency of the excitation current to reduce an intensity of the excitation current to an amount such that the excitation current is able to be transmitted to the rotor without overheating the rotor for the simulated operation state of the generator.

7. The apparatus as claimed in claim 1, wherein an Electromagnetic Core Imperfection Detection (ELCID) test is performed.

8. The apparatus as claimed in claim 7, further comprising a thermal sensor to monitor the temperature of the stator core during testing.

9. A method for testing a stator core of a generator comprising:
   providing an excitation current having a base frequency by a power supply;
   converting the base frequency to an excitation frequency by a frequency convertor, wherein the excitation frequency is greater than the base frequency;
   transmitting the excitation current with the excitation frequency over an excitation winding, with a single loop, formed by a connection of an excitation cable at both axial ends of a rotor installed within the stator core, and wherein the frequency convertor is connected to the excitation winding; and
   exciting the single excitation winding to perform the testing of the stator core that simulate an operation state of the generator increasing temperature of the stator core without overheating the rotor during testing.

10. The method as claimed in claim 9, wherein the excitation cable is connected to a rotor shaft of the rotor at the two axial ends in a location beyond a rotor retaining ring.

11. The method as claimed in claim 9, wherein the base frequency of the excitation current is at 50 Hz or 60 Hz.

12. The method as claimed in claim 9, wherein a loop test is performed.

13. The method as claimed in claim 9, wherein an Electromagnetic Core Imperfection Detection (ELCID) test is performed.

14. The method as claimed in claim 13, wherein the simulated operation state of the generator causes a hot spot on the stator core.

15. The method as claimed in claim 13, wherein the excitation frequency of the excitation current is greater than the base frequency of the excitation current to reduce an intensity of the excitation current to an amount such that the excitation current is able to be transmitted to the rotor without overheating the rotor for the simulated operation state of the generator.

16. The method as claimed in claim 13, further comprising monitoring the temperature of the stator core by a thermal sensor during testing.

* * * * *